United States Patent [19]

Yuhara et al.

[11] Patent Number: 4,775,814
[45] Date of Patent: Oct. 4, 1988

[54] SAW DEVICE

[75] Inventors: Akitsuna Yuhara, Kawasaki; Jun Sasaki, Sagamihara; Tetsuya Hirashima; Jun Yamada, both of Yokohama, all of Japan

[73] Assignee: Hitachi, Ltd., Tokyo, Japan

[21] Appl. No.: 51,523

[22] Filed: May 19, 1987

[30] Foreign Application Priority Data

May 21, 1986 [JP] Japan .................................. 61-114540

[51] Int. Cl.⁴ ............................................. H01L 41/08
[52] U.S. Cl. ............................ 310/313 R; 310/313 B; 310/313 D; 310/364
[58] Field of Search ........... 310/313 R, 313 A, 313 B, 310/313 C, 313 D, 363, 364, 365, 366; 333/150–155, 193–196

[56] References Cited

U.S. PATENT DOCUMENTS

| | | | |
|---|---|---|---|
| 4,472,652 | 9/1984 | Brice et al. | 310/364 X |
| 4,489,250 | 12/1984 | Ebata et al. | 310/364 X |
| 4,635,009 | 1/1987 | Ebata et al. | 310/313 D X |

Primary Examiner—Mark O. Budd
Attorney, Agent, or Firm—Antonelli, Terry & Wands

[57] ABSTRACT

In a SAW device comprising a piezoelectric substrate and at least one set of metallic electrodes formed on the piezoelectric substrate, at least one set of the electrodes have a laminated structure comprised of a layer of an aluminum film added with an impurity at a concentration of 6 wt. % or less and another layer of a film of pure aluminum or aluminum added with an impurity at a concentration of 0.4 wt. % or less. The SAW device having the laminated structure of electrodes can handle high frequency electric signals of higher power and/or larger amplitudes.

25 Claims, 3 Drawing Sheets

SAW DEVICE

BACKGROUND OF THE INVENTION

The present invention generally relates to a surface acoustic wave device (hereinafter referred to as SAW device in abbreviation). More particularly, the invention concerns a SAW device capable of handling electric signals of high power and/or a large amplitude.

At present, the SAW device finds a wide range of utilization and application and is employed as a SAW filter adapted for transmission of high electric power or as a SAW resonator in which a surface wave of a large amplitude is continuously present as a standing wave. However, the SAW devices mentioned above suffer short-comings in that defects similar to hillocks, voids or the like due to electro-migration which take place in Al-metallized electrodes in semiconductor IC devices are produced in fine fingers of aluminum (Al) serving as SAW transmission/reception electrodes and reflector electrodes in the SAW devices, as is reported in "Thin Solid Films", 64, 9-15 (1979) (J. I. Latham et al), pp. 9-14 and "Transactions of The Institute of Electronics Communication Engineers of Japan", Vol. J67-C, pp. 278-285 (Mar., 1984). Under the circumstances, SAW resonators undergo unwanted phenomenon such as frequency deviation or shift from the resonance frequency. On the other hand, in the case of the SAW filter designed for high power transmission, there often arise failures such as short-circuit, wire breakage and the like due to the growth of hillocks, as is reported in "1983 IEEE Ultrasonic Symposium Proceedings", pp. 83-86 (1983). In particular, the second mentioned literature explains the generating mechanism of such failure as follows: "Strain in a substrate surface produced by the SAW induces an internal stress in the Al-thin film formed on the substrate surface, as a result of which Al-crystalline grain boundary migrates in a region where the stress exceeds a threshold, giving rise to creation of the voids and hillocks. The migration of the grain boundary is believed to be ascribable to such mechanism as experienced in the thermal cycle of ICs, as reported in IEEE Trans, Parts, Hybrids and Packaging, Vol. PHP-7, pp. 134-138, Sept. 1971". All of the literature mentioned above disclose that the failures due to Al-migration can be dealt with by adding a small amount (1 to 4 wt. %) of copper (Cu) to Al forming the conductors in the semiconductor ICs and that this method is effective for suppressing the migration.

However, as the frequency becomes higher, the strains due to SAW become greater even when the power for transmission and the amplitude remain unchanged. In the case of the SAW resonator designed for handling signals of frequencies higher than 300 MHz such as a SAW filter employed in a transmitter of a cellular radio telephone system of a 800 MHz-band and the like, an adequate useful life can not be assured because of occurrence of the above-mentioned migration in operation with high power and/or a large amplitude even with the Al-electrode having Cu added and formed through vacuum evaporation or EB evaporation disclosed in the literature enumerated above.

It is further noted that formation of Al-film containing an additive of Cu through the vacuum evaporation or EB evaporation tends to increase the hardness of film, making it difficult to employ the wire bonding which is another disadvantage. On the other hand, when a dry etching process is adopted for forming fine electrodes with a high precision for the purpose of enhancing the high frequency performance, the electrodes are susceptible to corrosion or the like (e.g., due to the inclusion of Cl), givin rise to a problem that the yield is degraded significantly.

Another method of suppressing the electromigration is described in J. Appl. Phys., 49 (7), pp. 4083-4093, July 1987. The method described in this literature is featured as follows. More particularly, the wiring in a semiconductor IC is of a multilayer comprising a first layer of an Al film which includes Cu as an impurity and a second layer of, for example, a hafnium (Hf) film which is exclusive of Al and much thinner than the first Al film layer.

With the above prior art, when a Hf film is exemplarily used as the second layer, a good migration-proof characteristic can be obtained but, on the other hand, Hf molecules in the second layer easily diffuse into the Al of the first layer. Therefore, in an application wherein the semiconductor IC with the multilayer wiring is operated for a long period of time at a temperature of about 80° C., the first layer Al film and the Hf molecules in the second layer are accelerated for alloying together, resulting in a considerable increase in resistivity of the overall film. Accordingly, a SAW device incorporating such a wiring structure suffers from a drastic increase in power loss and can not sustain its utilization as required.

In co-pending application (A. Yuhara et al) Serial No. 2,286 (based on Japanese Patent Application Nos. 3428/86 and 46138/86) filed Jan. 12, 1987 and assigned to the assignee of the present invention, a SAW device is disclosed in which electrodes are formed on a piezoelectric substrate by sputtering and/or the electrodes contain an additive of Cu, Ti, Zn, Mg, Fe, Ni, Cr, Ga, Ge, Sn, Pd or Ta.

SUMMARY OF THE INVENTION

An object of the present invention is to provide a highly reliable SAW device which can sustain its operation for a long period of time even when a high power (large amplitude) SAW is applied to the SAW device.

As far as the inventors know, no prior art has taught a SAW device of a multilayer structure comprised of a first layer of an Al film and a second layer of an Al film added with an impurity.

According to one aspect of the present invention, at least one of electrodes for excitation, propagation and reflection of a SAW has a laminated structure including a first layer of an Al film which is either made of pure Al or made of Al added with a first impurity at a low concentration and a second layer of an Al film which is disposed in laminated relationship with the first layer and added with a second impurity at a low concentration. As the first impurity, any one of titanium (Ti), copper (Cu), magnesium (Mg), zinc (Zn) and nickel (Ni) may be used and as the second impurity, any one of titanium, chromium (Cr), vanadium (V) and manganese (Mn) may be used.

Beneficial effects of some embodiments of the invention will be described. For example, if the second layer of the electrodes is simply a film of Ti alone, then this second layer of Ti will become a powerful Ti diffusion source for the Al film of the first layer. Accordingly, when a SAW device with such an electrode structure is operated for a long period of time at a high temperature, Al in the first layer and Ti in the second layer will almost alloy together. Consequently, in an instance where the ratio of film thickness between the first and second layers is 99:1, resistivity of the electrodes being originally 2.72 $\mu\Omega.cm$ is considerably increased up to 5.8 $\mu\Omega.cm$ after the alloying. Such a SAW device is therefore impractical.

To the contrary, when an electrode structure exemplarily comprises a second layer of an Al film added with Ti in 2 wt. % and a first layer of a pure Al film (for example, with the ratio of film thicknesses there between being 9:1) in accordance with an embodiment of the present invention, an increase in resistivity of the electrodes being originally 2.9 $\mu\Omega.cm$ can be suppressed to 3.3 $\mu\Omega.cm$ even if Al in the first layer and Ti in the second layer alloy together. This suppressed increase does not have practical problems. In comparison with the second layer of Ti alone, the second layer having the Al film added with Ti as in one embodiment of the present invention does not substantial act as a Ti diffusion source for the first layer so that the first and second layers are difficult to alloy together. Therefore, Ti in the second layer is, selectively trapped at the most in an Al crystalline grain boundary, feasible to diffuse, in the first layer and no appreciable degradation (increase) with time of the resistivity will occur. Further, the second layer in the form of the Al film added with Ti in 2 wt. % has a migration-proof characteristic which is superior to that of the second layer of Ti alone, indicating that the overall second layer effectively suppresses the occurrence of hillocks, voids and the like due to electro-migration in the first layer. In addition, the Ti selectively trapped in the Al crystalline grain boundary in the first layer can suppress diffusion of the grain boundary of Al atom and for this reason the first layer can by itself improve the migration-proof characteristic. For all the reasons described above, reliability of the SAW device under the application of a high power SAW can be improved considerably.

Thus, a material having a good migration-proof characteristic, even though exhibiting a large resistivity in itself or when added to Al, is added by a small amount to the Al film of the second layer to thereby decrease initial resistivity of the electrodes. In addition, a change with time in the resistivity of the electrodes is suppressed and reliability of the SAW device is improved.

DESCRIPTION OF THE PREFERRED EMBODIMENTS

The invention will now be described by way of example with reference to the accompanying drawings.

Figure 1:
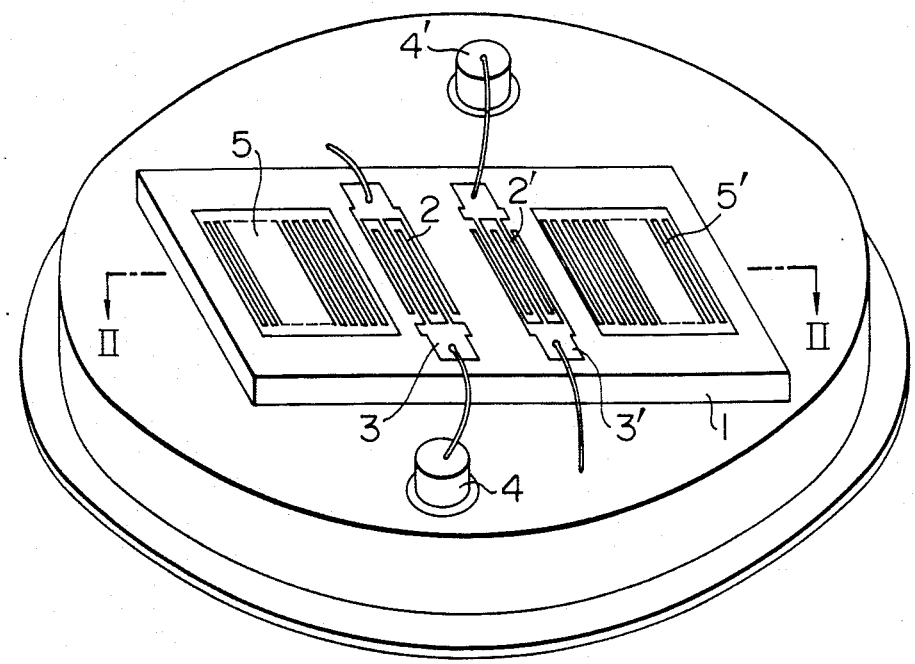
FIG. 1 is a perspective view showing a SAW device according to an exemplary embodiment of the present invention.
Figure 2:
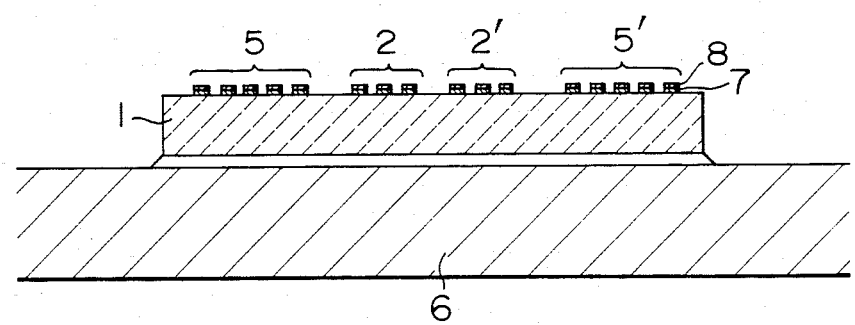
FIG. 2 is a view showing a cross-section taken along the line A—A in FIG. 1.

FIG. 1 shows, in perspective view, a SAW device according to an embodiment of the invention and FIG. 2 shows a section taken on the line A—A of FIG. 1. Referring to the figures, a reference numeral 1 denotes a piezoelectric SAW substrate formed of ST-cut quartz crystal on which a pair of transmitting and receiving electrode arrays 2 and 2' are disposed, each array including 28 pairs of fingers with aperture thereof being 1000 $\mu m$ for mutually transmitting and receiving SAW. The electrodes are connected to bonding pads 3, 3' by way of bus electrodes, while the bonding pads 3, 3' are electrically connected to input/output pins 4 and 4' of a stem of a can package by means of bonding wires of Al or Au. The bus electrodes located on the ground side of the transmitting/receiving electrodes are grounded to the stem 6 of the can package through the grounding bonding pads. Each of the pair of electrodes 2 and 2' includes one set of interleaved comb-like finger electrodes. Disposed on both sides of the aforementioned pair of transmitting/receiving electrodes 2 and 2' are reflector electrodes 5 and 5' composed of 750 metallic strips to thereby constitute a two-port SAW resonator. In the version of this embodiment, the metallic strips 5 may be replaced by slits formed in the substrate 1 serving as the reflectors. Each of the aforementioned transmitting/receiving electrodes 2, 2' and the reflector electrodes has a film thickness of 0.1 $\mu m$. The two-port SAW resonator thus realized has a resonance frequency of 697 MHz and Q approximately equal to 4000. As shown in FIG. 2, each of the electrodes is of a two-layer structure comprising a first layer 7 and a second layer 8. A part of the electrode is illustrated, in enlarged sectional view form, in FIG. 4a. The first layer 7 is made of pure Al, having a film thickness of 0.08 $\mu m$. The second layer 8 is made of Al with Ti added in 2 wt. % and has a film thickness of 0.02 $\mu m$. The electrodes each comprised of the first and second layers was deposited by DC magnetron sputtering which is best suited for this type of metallic film among various sputtering methods. After deposition of the film, the electrode pattern was formed through a photoetching process.

Figure 3:
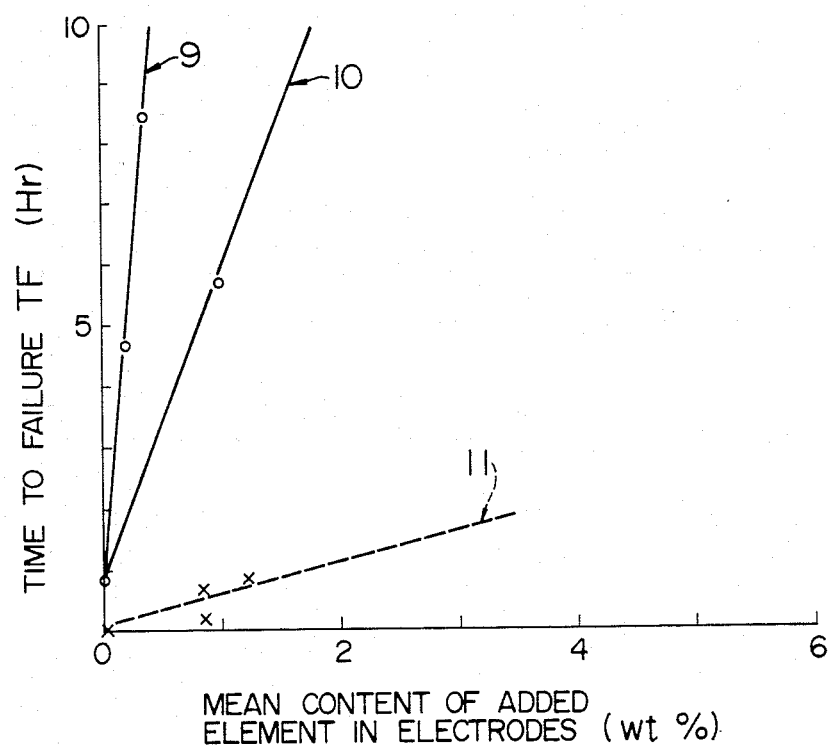
FIG. 3 is a characteristic diagram illustrating results of an accelerated life test conducted on an apparatus according to an embodiment of the invention and incorporating the SAW device shown in FIGS. 1 and 2.

Results of an accelerated life test conducted on the saw resonators according to the instant embodiment are graphically illustrated in FIG. 3 comparatively with a result obtained from a specimen manufactured by EB evaporation of Cu-added Al. In FIG. 3, abscissa represents a mean content or concentration, in terms of wt. %, of Ti added to the second layer which is averaged over the overall electrode comprised of the first and second layers. For example, when in this embodiment the second layer is added by itself with Ti at a concentration of 2 wt. %, the Ti concentration becomes 0.4 wt. % for the overall electrode. This is because the film thickness of the second layer shares 0.02 $\mu m$ in the film thickness of the overall electrode being 0.1 $\mu m$ and the Ti concentration in the second layer can be converted into a concentration as viewed from the overall electrode by being multiplied by 1/5. Represented by abscissa in FIG. 3 is a concentration converted into a mean concentration for the overall electrode. Ordinate represents time to failure (TF). The time to failure indicates the time elapse until the resonance frequency is degraded to change. The conditions for the accelerated life test are selected such that the temperature is 120° C. and that the input power is 100 mW. In FIG. 3, a curve 11 represents experimental results on a comparative specimen prepared through conventional EB evaporation of Cu-added Al, a curve 9 represents experimental results on a specimen prepared in accordance with the present embodiment, and a curve 10 represents experimental results on a specimen in which the electrode is the same as that of the present embodiment in respect of configuration, thickness and the way of formation but the two-layer structure is replaced with a single layer structure of an Al film added with Ti over the overall electrode. Thus, it should be appreciated that curve 10 is not representative of data for a prior art example but is representative of data for comparison with the present embodiment for the effect of achieving another point of view.

As will be seen from FIG. 3, a SAW device having a TF of 8 hours or more can be obtained at a Ti mean concentration of 0.4 wt. % (2 wt. % Ti concentration in the second layer) on curve 9 according to the present embodiment, and a SAW device having a TF of 5 hours or less can be obtained at a Ti mean concentration of 0.2 wt. % (1 wt. % Ti concentration in the second layer) on curve 9. No degradation in frequency characteristic is found in either SAW device.

For comparison, a SAW device having the same electrode structure as that of the present embodiment with the only exception that the two-layer structure is replaced with the single layer structure with Ti additive over the overall electrode, that is, a SAW device represented by curve 10 has a TF of 11 hours or more at a Ti concentration of 2 wt. % in the electrode and a TF of about 5.5 hours at a Ti concentration of 1 wt. %.

To conclude, the comparison between curves 9 and 10 shows that the present embodiment (curve 9) can prolong the life by adding Ti to the electrode at a lower Ti mean concentration than that required for the example represented by curve 10.

Further, in the present embodiment, electrical resistivity of the electrodes is 3.3 $\mu\Omega$.cm with no appreciable degradation (increase) with time, indicating no practical adversities in respect of the resistivity and degradation with time.

As described above, with the electrode structure according to the present embodiment, a highly reliable SAW device can be obtained which is almost immune to time-degradation of resistivity and has an excellent migration-proof characteristic.

The dimensions such that the overall electrode thickness is 0.1 $\mu$m and the film thickness of the second layer is 0.02 $\mu$m in the foregoing embodiment are in no way limitative. However, since the resistivity of the electrodes increases as the film thickness of the second layer increases, an excessively large film thickness of the second layer leading to an excessively high resistivity of the electrodes is impractical. Accordingly, it is preferred that the film thickness of the second layer be about 50% of the overall electrode thickness at the most. With an excessively small film thickness of the second layer, on the other hand, the effects of the present invention can not be fulfilled. Accordingly, it is preferred that the film thickness of the second layer be 1% or more of the overall electrode thickness.

The amount of Ti added to the Al film of the second layer in the present embodiment should preferably be about 6 wt. % at the most because an excessively high concentration hardens the Al film excessively.

Further, Ti is added as an impurity to the second layer in the present embodiment but the impurity is not limited to Ti and an additive of Cr, V or Mn may be used to attain similar effects.

The pure Al film used as the first layer in the present embodiment may have an impurity added to further prolong the life of the SAW device, so long as the resistivity will not increase. Exemplarily, the additive impurity is Ti, Cu, Mg, Zn or Ni. Because of the requirement that the film resistivity be 5 $\mu\Omega$.cm or less, the amount of additive impurity is 0.4 wt. % or less. Thus, a small amount (about 0.4 wt. % or less) of the impurity may be added to the layer of low resistivity.

Figure 4A:
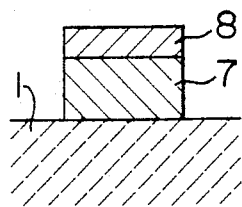
FIG. 4a is a partial enlarged sectional view showing a part of electrodes of the SAW device shown in FIGS. 1 and 2.
Figure 4B:
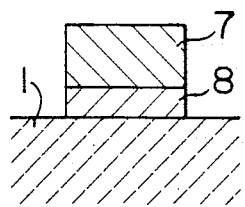
FIGS. 4b to 4h are partial enlarged sectional views showing various modifications of a part of electrodes according to the invention.

In the foregoing embodiment, the laminated structure is such that the first layer 7 of pure Al is next to the piezoelectric SAW substrate 1 and the second layer 8 added with an impurity overlies the first layer, as illustrated in FIGS. 2 and 4a, but this lamination is not limitative. The laminated relationship may be reversed without disturbing the effects described previously, so that the second layer 8 may be contiguous to the piezoelectric SAW substrate 1 and the first layer 7 may overlie the second layer 8. A modification to this effect is illustrated in FIG. 4b. The electrodes directed to this modification, a part of which is shown in enlarged sectional form in FIG. 4b, are the same as the FIG. 1 embodiment in respect of configuration and array pattern with the only exception that the laminated structure of the electrodes comprises the first layer 7 overlying the second layer 8. It should be noted here that "a first layer" means a layer made of Al or Al added with a first impurity and "a second layer" means a layer made of Al added with a second impurity. This also applies to the following description.

Further modifications of the electrodes are illustrated in FIGS. 4c to 4h which show a part thereof in enlarged sectional form. The electrodes directed to these modifications are the same as the FIG. 1 embodiment in respect of configuration and array pattern, excepting lamination structures.

Figure 4C:
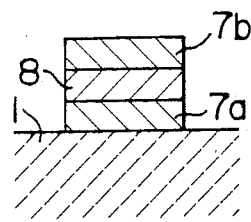

More specifically, the modification of FIG. 4c is of a three-layer structure in which a second layer 8 is disposed on a sub-layer 7a and a sub-layer 7b of the same material as that of the sub-layer 7a is disposed on the second layer 8. The sub-layers 7a and 7b constitute a first layer. This modification can attain similar effects to those of the FIG. 4a embodiment.

Figure 4D:
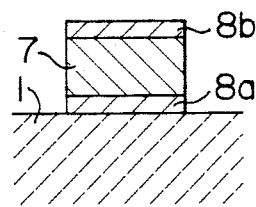

In the modification of FIG. 4d, a first layer 7 is disposed on sub-layer 8a of a second layer and a sub-layer 8b of the second layer is disposed on the first layer 7.

Figure 4E:
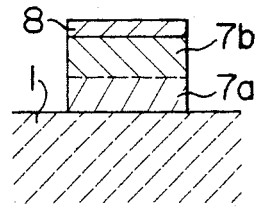

In the modification of FIG. 4e, a first layer comprises a sub-layer 7a, and a sub-layer 7b which overlies the sub-layer 7a and differs therefrom in properties by, for example, containing Al added with an impurity by an amount different from that for the sub-layer 7a, and a second layer 8 is disposed on the sub-layer 7b.

Figure 4F:
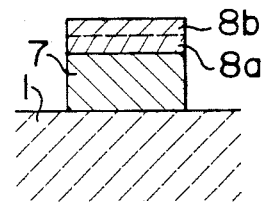

In the modification of FIG. 4f, a sub-layer 8a of a second layer is disposed on a first layer 7 and there is disposed on the sub-layer 8a a sub-layer 8b of the second layer which differs from the sub-layer 8a in properties by, for example, containing Al added with an impurity by an amount different from that for the sub-layer 8a.

Figure 4G:
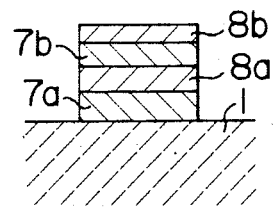

In the modification of FIG. 4g, a first layer comprises sub-layers 7a and 7b, a second layer comprises sub-layers 8a and 8b, and the sub-layers 7a, 8a, 7b and 8b are laminated in this order.

Figure 4H:
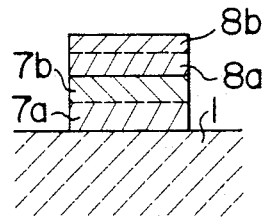

In the modification of FIG. 4h, a first layer comprises sub-layers 7a and 7b, a second layer comprises sub-layers 8a and 8b, and the sub-layers 7a, 7b, 8a and 8b are laminated in this order, the sub-layer 7b being different from the sub-layer 7a in properties and the sub-layer 8b being different from the sub-layer 8a in properties.

The various modifications described above indicate that the laminated structure of electrodes may be configured into a three-layer structure and a four-layer structure without disturbing the effects of the invention described hereinbefore. Similarly, the number of laminated layers may be increased to five or more.

In the FIG. 4a embodiment, the two-layer structure of electrodes may also be prepared by initially forming a first layer 7 and thereafter diffusing Ti into the surface of the first layer 7 to convert an upper portion of the first layer 7 into a second layer 8. In this case, the boundary between the first layer 7 and the second layer 8 is not distinct.

Although the embodiment of the invention described in connection with FIG. 1 is directed to a two-port SAW resonator having reflectors formed of metallic strips, the invention is not limited thereto and may be applied, without disturbing its achievable effects, to a one-port SAW resonator and a SAW filter for high power transmission from input electrodes to output electrodes as well as a resonator using a SAW transmitter/receiver.

Furthermore, the SAW substrate is not limited to the ST-cut quartz crystal but other types of various substrates with various cut orientations may effectively be used, including $LiNbO_3$, $LiTaO_3$ and the like.

We claim:

1. A SAW device comprising a piezoelectric substrate and sets of finger electrodes disposed on said piezoelectric substrate, at least one set of said electrodes having a laminated structure including a first layer of an aluminum film and a second layer of an aluminum film which is disposed in laminated relationship with said first layer and including with an impurity.

2. A SAW device according to claim 1, wherein the impurity is added to said second layer at a positive concentration of 6 wt. % or less.

3. A SAW device comprising a piezoelectric substrate and sets of finger electrodes disposed on said piezoelectric substrate, at least one set of said electrodes having a laminated structure including a first layer of an aluminum film and a second layer of an aluminum film which is disposed in laminated relationship with said first layers and including an impurity selected from the group consisting of titanium, chromium, vanadium and manganese.

4. A SAW device comprising a piezoelectric substrate and sets of finger electrodes disposed on said piezoelectric substrate, at least one set of said electrodes having a laminated structure including a first layer of an aluminum film and a second layer of an aluminum film which is disposed in laminated relationship with said first layer and including an impurity selected from the group consisting of titanium, chromium, vanadium and manganese, at a positive concentration of 6 wt. % or less.

5. A SAW device accoring to claim 1, wherein the aluminum film of said first layer includes an impurity selected from the group consisting of titanium, copper, magnesium, zinc and nickel, at a concentration of 0.4 wt. % or less.

6. A SAW device according to claim 2, wherein the aluminum film of said first layer includes an impurity selected from the group consisting of titanium, copper, magnesium, zinc and nickel, at a concentration of 0.4 wt. % or less.

7. A SAW device according to claim 3, wherein the aluminum film of said first layer includes an impurity selected from the group consisting of titanium, copper, magnesium, zinc and nickel, at a concentration of 0.4 wt. % or less.

8. A SAW device according to claim 4, wherein the aluminum film of said first layer includes an impurity selected from the group consisting of titanium, copper, magnesium, zinc and nickel, at a concentration of 0.4 wt. % or less.

9. A SAW device according to claim 1, wherein the overall film thickness of said first layer is larger than that of said second layer.

10. A SAW device according to claim 3, wherein the overall film thickness of said first layer is larger than that of said second layer.

11. A SAW device according to claim 4, wherein the overall film thickness of said first layer is larger than that of said second layer.

12. A SAW device according to claim 5, wherein the overall film thickness of said first layer is larger than that of said second layer.

13. A SAW device according to claim 6, wherein the overall film thickness of said first layer is larger than that of said second layer.

14. A SAW device according to claim 7, wherein the overall film thickness of said first layer is larger than that of said second layer.

15. A SAW device according to claim 8, wherein the overall film thickness of said first layer is larger than that of said second layer.

16. A SAW device comprising a piezoelectric substrate and sets of finger electrodes disposed on said substrate, at least one set of said electrodes having a laminated structure made up of a plurality of layers including at least one of a first layer type of an aluminum film and at least one of a second layer type of an aluminum film which includes an impurity selected from the group consisting of titanium, chromium, vanadium and manganese.

17. A SAW device according to claim 16, wherein said laminated structure includes a first layer of said first layer type formed on said substrate and a second layer of said second layer type formed on said first layer, the thickness of said first layer being greater than the thickness of said second layer.

18. A SAW device according to claim 16, wherein said laminated structure includes a first layer of said second layer type formed on said substrate and a second layer of said first layer type formed on said first layer, the thickness of said second layer being greater than the thickness of said first layer.

19. A SAW device according to claim 16, wherein said laminated structure includes a first layer of said first layer type formed on said substrate, a second layer of said second layer type formed on said first layer, and a third layer of said first layer type formed on said second layer, the combined thickness of said first and third layers being greater than the thickness of said second layer.

20. A SAW device according to claim 16, wherein said laminated structure includes a first layer of said second layer type formed on said substrate, a second layer of said first layer type formed on said first layer, and a third layer of said second layer type formed on said second layer, the thickness of said second layer being greater than the combined thickness of said first and third layers.

21. A SAW device according to claim 16, wherein said laminated structure includes a first layer of said first layer type formed on said substrate, a second layer of said second layer type formed on said first layer, a third layer of said first layer type formed on said second layer, and a fourth layer of said second layer type formed on said third layer, the combined thickness of said first and third layers being greater than the combined thickness of said second and fourth layers.

22. A SAW device according to claim 17, wherein said first layer type includes an impurity selected from the group consisting of titanium, copper, magnesium, zinc and nickel.

23. A SAW device according to claim 22, wherein said first layer includes first and second sublayers having different impurity concentrations.

24. A SAW device according to claim 22, wherein said first layer includes first and second sublayers having different impurity concentrations, and said second layer includes first and second sublayers having different impurity concentrations.

25. A SAW device according to claim 17, wherein said second layer has first and second sublayers having different impurity concentrations.

* * * * *